(12) United States Patent
D'Arcy et al.

(10) Patent No.: US 7,089,481 B2
(45) Date of Patent: Aug. 8, 2006

(54) HIGH SPEED ARITHMETIC OPERATIONS FOR USE IN TURBO DECODERS

(75) Inventors: Paul Gerard D'Arcy, Chelmsford, MA (US); Rajan V. K. Pillai, Atlanta, GA (US)

(73) Assignee: Agere Systems Inc., Allentown, PA (US)

( * ) Notice: Subject to any disclaimer, the term of this patent is extended or adjusted under 35 U.S.C. 154(b) by 352 days.

(21) Appl. No.: 10/201,013

(22) Filed: Jul. 22, 2002

(65) Prior Publication Data

US 2004/0015773 A1    Jan. 22, 2004

(51) Int. Cl.
*H03M 13/00*    (2006.01)
(52) U.S. Cl. .................. 714/794; 714/795; 714/796
(58) Field of Classification Search ............. 714/794, 714/795, 796
See application file for complete search history.

(56) References Cited

U.S. PATENT DOCUMENTS

| | | | | |
|---|---|---|---|---|
| 6,182,261 | B1 * | 1/2001 | Haller et al. ............. | 714/758 |
| 6,320,916 | B1 * | 11/2001 | Kobayashi et al. ........ | 375/341 |
| 6,330,684 | B1 * | 12/2001 | Yamanaka et al. ......... | 714/1 |
| 6,597,743 | B1 * | 7/2003 | Khayrallah et al. ....... | 375/265 |
| 2002/0042901 | A1 * | 4/2002 | Miyauchi et al. .......... | 714/799 |
| 2003/0002603 | A1 * | 1/2003 | Worm et al. ............... | 375/341 |
| 2003/0014712 | A1 * | 1/2003 | Yano et al. ................ | 714/786 |
| 2003/0061003 | A1 * | 3/2003 | Miyauchi et al. .......... | 702/181 |

OTHER PUBLICATIONS

U.S. Appl. No. 10/028,453, filed Dec. 24, 2001, P.G. D'Arcy et al., "High Speed Add-Compare-Select Operations for Use in Viterbi Decoders."
C. Berrou et al., "Near Shannon Limit—Correcting Coding and Decoding: Turbo-Codes (1)," IEEE, pp. 1064-1070, May 1993.
L.R. Bahl et al., "Optimal Decoding of Linear Codes for Minimizing Symbol Error Rate," IEEE Transactions on Information Theory, vol. IT-20, pp. 284-287, Mar. 1974.
R.G. Gallager, "Low-Density Parity-Check Codes," IRE Transactions on Information Theory, vol. IT-8, pp. 21-28, Jan. 1962.

* cited by examiner

*Primary Examiner*—Joseph Torres

(57) ABSTRACT

Techniques for performing substantially concurrent add-compare-select-add operations and substantially concurrent compare-select-add operations for use in turbo decoders are provided. In one aspect of the invention, a technique for processing data in accordance with a turbo decoder comprises the following steps. Data values of two sets of input data are respectively added to generate a set of sums. Substantially concurrent with the addition step, correction values are respectively added to the sums to generate a set of corrected sums. Substantially concurrent with the respective input data value and correction value addition steps, the sums are compared against one another, and an absolute value of a difference between the sums is compared against base and bound values. Then, one of the corrected sums is selected based on the comparison steps. Preferably, respective sub-steps within the input value addition step, the correction value addition step, and the comparison step are performed concurrently.

23 Claims, 6 Drawing Sheets

| 0 | a7 | a6 | a5 | a4 | a3 | a2 | a1 | a0 | ← a |
| 0 | b7 | b6 | b5 | b4 | b3 | b2 | b1 | b0 | ← b |
| 1 | $\overline{c7}$ | $\overline{c6}$ | $\overline{c5}$ | $\overline{c4}$ | $\overline{c3}$ | $\overline{c2}$ | $\overline{c1}$ | $\overline{c0}$ | ← $\overline{c}$ |
| 1 | $\overline{d7}$ | $\overline{d6}$ | $\overline{d5}$ | $\overline{d4}$ | $\overline{d3}$ | $\overline{d2}$ | $\overline{d1}$ | $\overline{d0}$ | ← $\overline{d}$ |
| | | | | | | | | 1 | ← CORRECTION BIT |

| COUT(0) | COUT(1) | REMARKS |
|---|---|---|
| 0 | 0 | p<q |
| 0 | 1 | p=q ⇒ p−q=0 |
| 1 | 0 | IMPOSSIBLE |
| 1 | 1 | p>q |

| | t7' | s7 | s6 | s5 | s4 | s3 | s2 | s1 | |
|---|---|---|---|---|---|---|---|---|---|
| 1 | t7 | t6 | t5 | t4 | t3 | t2 | t1 | t0 | ∅ |

| $x$ | LUT[$x$] |
|---|---|
| 0 | 6 |
| 1 | 5 |
| 2 | 5 |
| 3 | 4 |
| 4 | 4 |
| 5 | 3 |
| 6 | 3 |
| 7 | 3 |
| 8 | 3 |
| 9 | 2 |
| 10 | 2 |
| 11 | 2 |
| 12 | 2 |
| 13 | 1 |
| 14 | 1 |
| 15 | 1 |
| 16 | 1 |
| 17 | 1 |
| 18 | 1 |
| 19 | 1 |
| 20 | 1 |
| 21 | 1 |
| $\geq 22$ | 0 |

52 — STEP I:

EVALUATE $\{(d0 + d1)_H, (d0 + d1)_H + 1\}, \{(d0 + d1)_L, (d0 + d1)_L + 1,$
$(d0 + d1)_L + 2, (d0 + d1)_L + 3, (d0 + d1)_L + 4, (d0 + d1)_L + 5,$
$(d0 + d1)_L + 6\}, \{(d2 + d3)_H, (d2 + d3)_H + 1\}$ AND $\{(d2 + d3)_L,$
$(d2 + d3)_L + 1, (d2 + d3)_L + 2, (d2 + d3)_L + 3, (d2 + d3)_L + 4,$
$(d2 + d3)_L + 5\}$ CONCURRENTLY.

54 — STEP II:

EVALUATE CONDITIONS $\{[(d0 + d1) = (d2 + d3)], [(d0 + d1) \geq (d2 + d3)],$
$[0 < ((d0 + d1) - (d2 + d3)) \leq 2], [2 < ((d0 + d1) - (d2 + d3)) \leq 4],$
$[4 < ((d0 + d1) - (d2 + d3)) \leq 8], [8 < ((d0 + d1) - (d2 + d3)) \leq 12],$
$[12 < ((d0 + d1) - (d2 + d3)) \leq 21], [0 < ((d2 + d3) - (d0 + d1)) \leq 2],$
$[2 < ((d2 + d3) - (d0 + d1)) \leq 4], [4 < ((d2 + d3) - (d0 + d1)) \leq 8],$
$[8 < ((d2 + d3) - (d0 + d1)) \leq 12], [12 < ((d2 + d3) - (d0 + d1)) \leq 21]\}$
CONCURRENTLY.

56 — STEP III:

SELECT THE APPROPRIATE ELEMENT OF $(d0 + d1)_L$ + CORRECTION OR
$(d1 + d2)_L$ + CORRECTION (AS WELL AS THE OVERFLOW CARRIES) ON THE
BASIS OF COMPARISIONS PERFORMED IN STEP II. USE $[(d0 + d1) \geq (d2 + d3)]$
AND THE OVERFLOW CARRY FOR THE SELECTION OF A RELEVANT ELEMENT OF
$\{(d0 + d1)_H, (d0 + d1)_H + 1, (d2 + d3)_H, (d2 + d3)_H + 1\}$. CONCATENATE
THE MSB AND LSB SEGMENTS OF THE RESULT.

HIGH SPEED ARITHMETIC OPERATIONS FOR USE IN TURBO DECODERS

CROSS REFERENCE TO RELATED APPLICATION

The present application is related to the U.S. patent application identified by Ser. No. 10/028,453, filed on Dec. 24, 2001 and entitled "High Speed Add-Compare-Select Operations for Use in Viterbi Decoders," the disclosure of which is incorporated by reference herein.

FIELD OF THE INVENTION

The present invention generally relates to turbo decoders and, more particularly, to techniques for improving the performance of arithmetic operations performed by turbo decoders.

BACKGROUND OF THE INVENTION

The use of so-called "turbo codes" in decoders of communication systems was first proposed by C. Berru et al. in "Near Shannon Limit Error-Correcting Coding and Decoding: Turbo Codes," ICC'93, Geneva, Switzerland, pp. 1064–1070, May 1993, the disclosure of which is incorporated by reference herein. Since then, the error correcting capabilities of turbo codes have been of significant interest in communication system design.

In general, the decoding of turbo codes is performed by using soft input/soft output (SISO) decoders. SISO decoders provide a real number that serves as a measure of the probability of a correct decision on a received bit. The probability measures are iteratively improved. The SISO decoder proposed by C. Berru et al. incorporates a modified maximum a posteriori (MAP) decoding algorithm, also known as the Bahl, Cocke, Jelinek and Raviv (BCJR) algorithm, which was first proposed in L. Bahl et al., "Optimal Decoding of Linear Codes for Minimizing Symbol Error Rate," IEEE Transactions on Information Theory, Vol. IT-20, pp. 284–287, March 1974, the disclosure of which is incorporated by reference herein. A decoding technique that bears resemblance to the BCJR algorithm had been proposed by Gallager in his work on low density parity check codes, see, e.g., R. G. Gallager, "Low Density Parity Check Codes," IRE Trans. Inform. Theory, Vol. IT-8, pp. 31–38, January 1962, the disclosure of which is incorporated by reference herein.

The MAP algorithm evaluates the most likely information bit that might have been transmitted in a coded sequence. In contrast, the Viterbi algorithm determines the most likely code word that might have been transmitted. It is well known that MAP decoders outperform Viterbi decoders at low signal-to-noise ratios and high bit error rates. Owing to design economy considerations, a direct implementation of the original MAP algorithm in hardware is not favored.

However, simplifications of the MAP algorithm render feasible VLSI (very large scale integration) implementations. Known simplifications of the MAP algorithm include the "log-MAP" algorithm, the "max-log-MAP" algorithm and the "max*-log-MAP" algorithm. In the logarithmic domain, otherwise expensive multiplications and divisions are transformed to more inexpensive addition/subtraction operations. For example, in turbo decoders, add-compare-select-add operations are typically employed for evaluating state metrics used in determining the measure of probability of a correct decision on a received bit.

However, existing add-compare-select-add operations, as well as other arithmetic operations, are generally sequential in nature, which can lead to significant processing bottlenecks in the turbo decoders.

Thus, in turbo decoders, there is a need for techniques which improve arithmetic operation performance, which overcome the existing drawbacks inherent in a sequential handling of such operations.

SUMMARY OF THE INVENTION

The present invention provides substantially concurrent add-compare-select-add and substantially concurrent compare-select-add techniques for use in turbo decoders. As will be explained and illustrated in detail below, such techniques perform addition, comparison and look up table-based correction operations associated with a turbo decoder substantially simultaneously.

In one aspect of the invention, a technique for processing data in accordance with a turbo decoder comprises the following steps. Data values of two sets of input data are respectively added to generate a set of sums. Substantially concurrent with the addition step, correction values are respectively added to the sums to generate a set of corrected sums. The correction values preferably represent the set of all possible correction values. This results in the generation of a set of all possible values that the output data can assume.

Substantially concurrent with the respective input data value and correction value addition steps, the sums are compared against one another, and an absolute value of a difference between the sums is compared against base and bound values. Thus, by comparing the sums against one another, the larger of the sums may be identified. Further, by comparing an absolute value of a difference between the sums against base and bound values, the magnitude of the appropriate correction value that is added to the identified larger sum is resolved. Then, one of the corrected sums is selected based on the comparison steps. Preferably, respective sub-steps within the input value addition step, the correction value addition step, and the comparison step are performed concurrently.

Furthermore, a data value is preferably respectively partitioned into a higher order component and a lower order component. For example, the lower order component of an data value may comprise m bits and the higher order component of the data value may comprise (n−m) bits, where n is the width of the data value. Correction values are preferably added to lower order components of associated sums.

Advantageously, as will be explained herein, the input value addition step, the correction value addition step, the comparison step, and the selection step may be performed in association with an add-max* operation and/or a max* operation of the turbo decoder. Also, the present invention advantageously transforms the correction value lookup table operation associated with conventional add-max* and max* operations into a concurrent comparison operation. Therefore, such lookup table read operations are not needed in a turbo decoder formed according to the present invention.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 5 is a flow diagram illustrating an add-max* algorithm according to an embodiment of the present invention;

DETAILED DESCRIPTION OF THE PREFERRED EMBODIMENTS

The present invention will be illustratively described below in the context of add-compare-select-add operations and compare-select-add operations associated with turbo decoders. However, it is to be understood that the invention may be more generally applicable to other decoders which perform arithmetic operations that would benefit from an increase in processing efficiency realized by performing such operations substantially concurrently versus sequentially.

For convenience of reference, the detailed description will be divided into the following sections: (I) Turbo Decoder Arithmetic; (II) Sequential Add-Compare-Select-Add Operation; (III) Concurrent Add-Compare-Select Operation; (IV) Concurrent add-max* Algorithm; (V) Concurrent Add-Compare-Select-Add Logic; (VI) Concurrent Compare-Select-Add Logic; (VII) Comparator Organization; (VIII) Implementation Considerations; and (IX) Instruction Set Comparison.

I. Turbo Decoder Arithmetic

As is known, decoder implementation necessitates computations for evaluation of branch metrics, forward state metrics, reverse state metrics and log likelihood ratios (LLRs). The log domain computation of state metrics typically involves the evaluation of an equation of the type given as:

$$\alpha_k(s_k) = \ln(e^{A_0} + e^{A_1}) \quad (1)$$

where $\alpha_k$ represents a state metric for a typical state $s_k$ in the trellis. Evaluation of $A_0$ and $A_1$ involves summation of previous state metrics with the relevant branch metrics. An approximation of the logarithm of the sum of the exponentials is given by:

$$\ln(e^{A_0} + e^{A_1}) = \max(A_0, A_1) + \ln(1 + e^{-|A_0 - A_1|}) \quad (2)$$

where max $(A_0, A_1)$ implies the selection of the larger of $A_0$ and $A_1$. The function represented by the ln (natural log) term in equation (2) is generally implemented through look up tables (LUT).

Not all decoder implementations comply with equation (2) as far as computation for the evaluation of metrics is concerned. There are implementations that discard the ln term from the computations altogether. With such an approximation, equation (1) simplifies into:

$$\alpha_k(s_k) = \ln(e^{A_0} + e^{A_1}) = \max(A_0, A_1) \quad (3)$$

Log-MAP algorithms that perform evaluation of $\ln(e^{A_0} + e^{A_1})$ function on the basis of equation (2) are generally referred to as max*-log-MAP algorithms, while those which follow the approximation defined by equation (3) are generally referred to as max-log-MAP algorithms. In decoder performance, the approximation given in equation (3) results in a deterioration of signal-to-noise ratio. With the same input energy per bit ratio, the bit error rate (BER) of decoders that employ the approximation suggested by equation (3) are worse than that of decoders that comply with equation (2).

II. Sequential Add-Compare-Select-Add Operation

Figures 1, 2A, 2B:
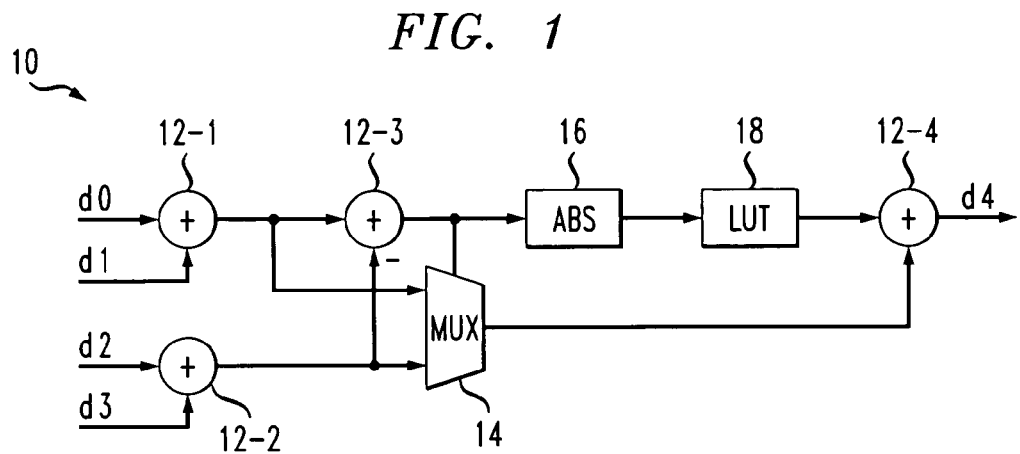
FIG. 1 is a block diagram illustrating a sequential add-compare-select-add module.
FIGS. 2A through 2D are tables illustrating multi-operand add-compare techniques and a block diagram generally illustrating a concurrent 2-way ACS module employing such techniques.

FIG. 1 illustrates a block schematic of an add-compare-select-add structure that evaluates max*((d0+d1), (d2+d3)). It is to be understood that each d represents an n-bit binary data word, e.g., 8-bit unsigned binary number. As illustrated, d0 and d2 may represent previous state metrics and d1 and d3 may represent relevant branch metrics. The branch metrics d1 and d3 may have the same numerical value, while their signs are opposite.

As shown, the structure 10 includes adder blocks 12-1 through 12-4, a multiplexer block 14, an absolute value block 16 and a look up table 18. The structure concurrently evaluates d0+d1 in adder block 12-1 and d2+d3 in adder block 12-2 (i.e., first add operation). Once this step is completed, a subtraction of (d2+d3) from (d0+d1) is performed in adder (subtractor) block 12-3 (i.e., compare operation). The sign of the result from this step indicates the relative magnitudes of (d0+d1) and (d2+d3) and this information is used for the selection of the larger quantity in accordance with multiplexor block 14 (i.e., select operation). The absolute value of the difference |(d0+d1)−(d2+d3)|, computed in absolute value block 16, drives the selection of an appropriate entry from the look up table 18. The selected entry is added with the larger of (d0+d1) and (d2+d3) in adder block 12-4 to generate d4 (i.e., second add operation).

As is evident, the implementation illustrated in FIG. 1 is intimately sequential. The comparison operation cannot start until additions are completed. Also, there is a full carry propagate addition of an entry from the look up table with the larger of (d0+d1) and (d2+d3) after the selection. These limitations are the cause of a significant processing delay in a turbo decoder that employs such sequential implementations.

II. Concurrent Add-Compare-Select Operation

Before explaining details of the solutions provided by the present invention for overcoming the processing delays associated with the sequential nature of the add-compare-select-add operation employed in a conventional turbo decoder, a solution for improving the processing delays associated with the sequential nature of the add-compare-select (ACS) operation employed in a Viterbi decoder will first be presented. Such a Viterbi decoder solution is provided in the above-referenced U.S. patent application identified by Ser. No. 10/028,453, filed on Dec. 24, 2001 and entitled "High Speed Add-Compare-Select Operations for Use in Viterbi Decoders," which has a common inventorship and is commonly assigned with the present application. A brief description of the concurrent techniques presented therein will now be given in the context of FIGS. 2A through 2D.

As explained in the above-referenced application, the speed performance of ACS operations in Viterbi decoders suffers mainly due to the sequential handling of addition and comparison operations. The invention of the above-referenced application realizes that both the addition and comparison operations associated with a Viterbi decoding algorithm can be substantially concurrently performed. To this end, an operation of the type a±b>c±d (where a and b are to be added, c and d are to be added, and then the sums compared to determine the larger of the two sums) can be formulated into a±b−c∓d>0 (where the addition of a and b and of c and d, and their comparison, are substantially concurrently performed). More specifically, in order to facilitate substantially concurrent addition and comparison operations in a Viterbi decoder, in one embodiment, the invention of the above-referenced application performs multi-operand addition in a carry save form. With the results of addition represented in carry save form, the evaluation of comparator conditions is rather straightforward, as will be illustrated in detail below.

Figures 2C, 2D:
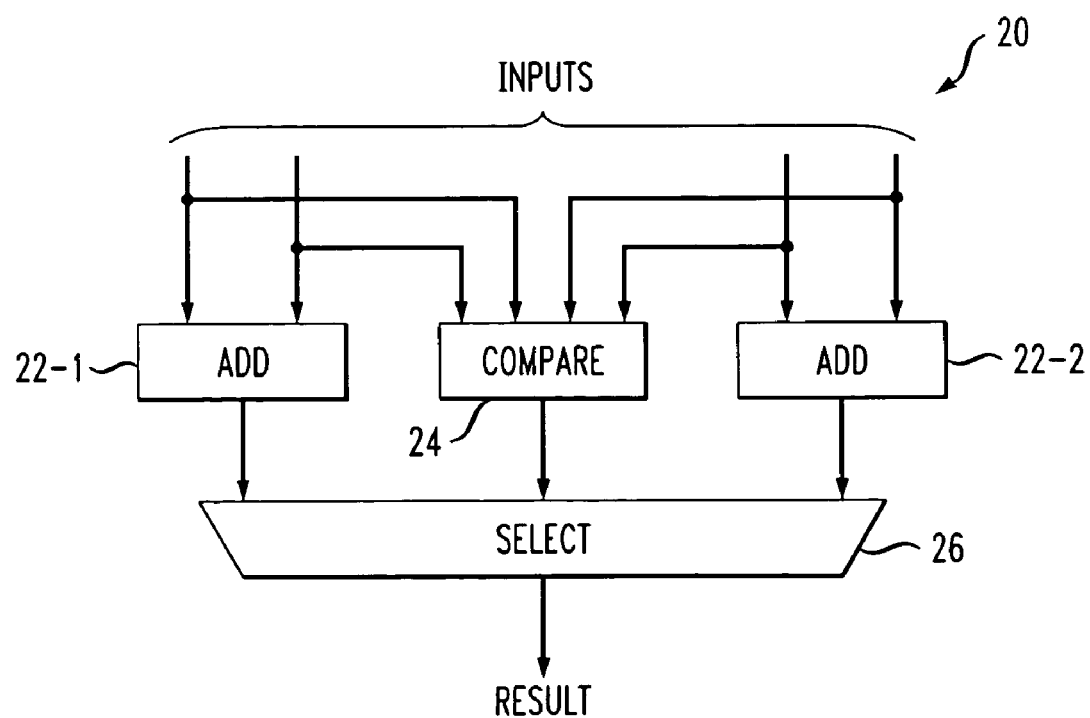

The add and compare operations of the invention of the above-referenced application are performed substantially concurrent with one another. First, the add operations start as soon as the inputs are available. Inputs comprise appropriate path and branch metrics. Comparison operations do not start immediately upon availability of the inputs, but rather start after a certain degree of pre-processing is performed. Such pre-processing involves the evaluation of a set of two outputs from four inputs, referred to as 4:2 compression. The inputs before this compression appear in the form represented in FIG. 2A, while FIG. 2C represents the outputs of these 4:2 compressors.

In general, the generation of a select signal follows the comparison. The select signal appears after the completion of addition. However, in contrast to the timing of the appearance of the select signal in the sequential add-compare scheme, a select signal appears appreciably earlier in the overall ACS operation of the invention of the above-referenced application. It is to be understood that the actual timing relationship is decided by the particular implementation. Accordingly, in a preferred embodiment, with state-of-the-art circuit techniques being used to implement the invention of the above-referenced application, the addition and comparison operations can be completed in almost complete concurrence.

FIGS. 2A and 2B illustrate the techniques of multi-operand add-compare according to an embodiment of the invention of the above-referenced application. Specifically, FIG. 2A illustrates the data representation for 1's complement addition of the type $a+b+\overline{(c+d)}$ involving 8 bit unsigned data a, b, c and d, where $\overline{(c+d)}$ represents the 1's complement of (c+d). As is known in binary number representation, a first binary number can be subtracted from a second binary number by converting the first binary number to a 1's complement representation and then adding the 1's complement representation of the first binary number to the second binary number. In 1's complement representation, the 1's complement of a binary number is formed by changing each 1 in the number to a 0 and each 0 in the number to a 1. When 1's complement addition is performed, any end around carry is added to the LSB (least significant bit) of the number generated.

It is to be understood that the '1' shown at the least significant bit position (a0, b0, etc.) in FIG. 2A is a correction bit, not the end around carry. In binary arithmetic, the 1's complement of (a+b) denoted by $\overline{(a+b)}$ equals $\overline{(a)}+\overline{(b)}+1$. Addition of this '1' is a correction step. It is this '1' that appears at the LSB of FIG. 2A. A generalization of this can be stated as follows: the 1's complement of the sum of n numbers is, by definition, equal to the sum of the 1's complements of these numbers plus (n−1).

Further, the end around carry in 1's complement addition also reveals the relative magnitudes of input operands. During an operation of the type $p+\overline{q}$ involving unsigned integer data p and q, an end around carry of 1 indicates that the result is positive, which implies p>q. With 1's complement conditional sum addition, the carry outputs contain yet a higher level of information regarding the relative magnitudes of the input operands. FIG. 2B presents an analysis. As shown in FIG. 2B, Cout(0) and Cout(1) represent the conditional carry outputs from the MSB end of an adder anticipating input carries of 0 and 1, respectively. Incidentally, it may be observed that the conditional carry output Cout(1) represents the carry output from the MSB end of a 2's complement adder that performs the operation p−q. As is known, in 2's complement, a binary number is formed by changing each 1 in the number to a 0 and each 0 in the number to a 1, and then adding 1 to the LSB of the number generated. It may be further observed that since p>q and p<q are mutually exclusive conditions, an evaluation of the third condition p=q is virtually free, i.e., p=q condition is true if and only if neither p>q nor p<q.

It is to be understood that the 1's in the leftmost column of FIG. 2A represent sign bits, which indicate that the number represented by the particular row of bits is negative. We already know that these are 1's complement numbers. With reference to FIGS. 2A and 2C, the t7, t7' bit position occurs on the left side of the a7, b7, $\overline{c7}$, $\overline{d7}$ bit position.

Further, it is to be understood that the symbol φ in FIG. 2C represents don't care, a typical terminology followed by logic designers. The bit indicated don't care remains don't care as far as the evaluation of a single comparator condition (here, p>q and its complement p≦q) is concerned. However, if a third condition p=q is to be inferred, then the assertion of this bit also has to be taken into account. In other words, to generate the signal Cout(1) of FIG. 2B, we have to take into account the bit marked don't care. However, for the evaluation of Cout(0), this is not required. In Viterbi decoders, we are only interested to see whether one of the potential candidate metrics is greater than or equal to its peers. Hence, we can conveniently ignore the bit marked don't care so that the carry evaluation circuits are simpler.

In accordance with the invention of the above-referenced application, the data represented in FIG. 2A can be compressed together using a single level of 4:2 compressors. With the compressed outputs, evaluation of a±b>c±d involves the computation of a carry output from the t7, t7' bit position. As explained above, a carry out of 1 implies a±b>c±d and a carry out of 0 implies the complementary condition, i.e., a±b≦c±d.

In carry propagate addition, there are three mutually exclusive carry conditions at each bit position. These are: generate, propagate or kill. Generate implies the generation of a carry. Propagate implies no carry generation, but in case a carry from a lower order bit position is injected at a particular bit position, it gets propagated to the next higher order bit position. Carry kill implies that if a carry is injected at a bit position, it never propagates beyond that position. In carry propagate adders, the above carry conditions at each bit position are evaluated. Now, a "carry chain network" combines the impact of these conditions starting from the least significant bit position towards the most significant bit position. This network spans the entire width of an adder. With the above approach, one can also define carry properties like; group generate, group propagate and group kill. For example, if we define these conditions on a 16 bit adder, the group generate signal (of this 16 bit group) reveals whether this 16 bit group will produce a carry output. The group propagate and kill conditions respectively indicate the other carry conditions.

The computation of a carry output from the t7, t7' bit position involves the evaluation of a group carry generate signal. The carry network, in this case, spans from the t0, s1 bit position to the t7, t7' bit position.

The idea of performing comparison without performing carry propagate addition, as described above, can be generalized as follows. Operations of the type:

$$\sum_{i=0}^{k} p_i > \sum_{j=0}^{l} q_j \qquad (4)$$

involving integer/2's complement/fixed point data $p_i$, $q_j$ can be easily handled by the above-described technique. Also, there is no limitation that the comparison operation need be restricted to strict inequality, rather $>$, $\geq$, $=$, $<$, $\leq$ or any combination of these conditions can be handled. It is to be understood that, in all these cases, appropriate transformations on data are warranted so that the compress-carry evaluate operation always produces the end around carry of a 1's complement adder, i.e., Cout(0) (plus Cout(1), if desired).

Extending this approach a step further, and realizing that even multiplication can be considered a multi-operand addition problem, concurrent comparison of multiply-add results may also be performed in accordance with the invention of the above-referenced application.

By employing the above-described compression and carry techniques, the comparison operation can begin as soon as the input data a, b, c and d is available. Advantageously, unlike the sequential approach, there is no need to wait for the completion of a+b and/or c+d. In general, it is known that the fastest carry propagate adders deliver results in logarithmic time. This is also known to be true with respect to comparators as well. Thus, with the above-described techniques, the carry save addition/compression of input operands is handled in constant time, irrespective of the data size. Because of this, the time complexity of the ACS techniques of the invention of the above-referenced application is less than that of the conventional ACS techniques.

FIG. 2D is a block diagram generally illustrating a 2-way ACS module according to an embodiment of the invention of the above-referenced application. As illustrated in FIG. 2D, the ACS module 20 comprises two add blocks 22-1 and 22-2, a compare block 24, and a select block 26. As is evident, the inputs to the ACS module of FIG. 2D are provided to both the add blocks 22-1 and 22-2 and the compare block 24. Thus, in accordance with the invention of the above-referenced application, the add blocks add their inputs and the compare block compares the inputs (employing the compression and carry techniques described above) at substantially the same time. The compare block instructs the select block to output the larger of the two metrics generated by the add blocks as the ACS result. With this arrangement, the comparison operation is performed substantially concurrently with addition, and the select signals are available approximately during the same time the path metrics are available.

IV. Concurrent Add-Max* Algorithm

Given how the shortcomings of sequential ACS operations in Viterbi decoders have been overcome by the implementation of concurrency in the above-referenced application, the detailed description turns back to the solutions provided by the present invention in the context of add-compare-select-add operations in turbo decoders.

In accordance with the present invention, it is to be understood that a max* operation of the type max*($(d_0+d_1)$, $(d_2+d_3)$), that performs an add-compare-select-add operation, is defined herein as an "add-max* operation."

Further, in accordance with the present invention, data depicted by the (n−m) higher order bits of an operand d is defined by $d_H$, while data depicted by the m lower bits is defined by $d_L$, where n represents the width of the operand d in bits. In addition, (n−m) higher order bits of the results of an operation Op are defined by Op(<arguments>)$_H$, while the lower order segment of the result is defined by Op(<arguments>)$_L$. For example, the data rendered by the (n−m) higher order bits of the results of max and max* operations are represented by max($A_0$, $A_1$)$_H$ and max*($A_0$, $A_1$)$_H$, respectively.

Figures 3, 4:
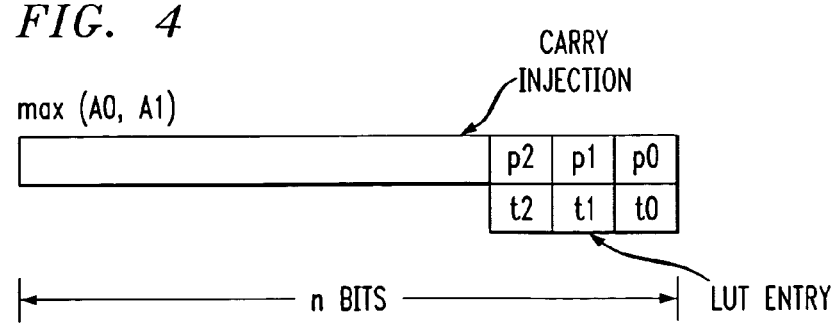
FIG. 3 is an example of a look up table (LUT) for use in max* computations.
FIG. 4 is a diagram illustrating the impact of the summation of LUT entries with a max (A0, A1) operation.

Before explaining the concurrent add-max* algorithm of the invention, an example of a look up table (LUT) for max* computations is shown in FIG. 3. As is evident, the LUT entries obey certain base and bound restrictions related to the range of its input argument x. Analyzing equation (2), it is clear that the result of a max* computation is a corrected version of the result of a max operation. The correction operation involves the addition of an entry from the LUT with the result of the max operation.

FIG. 4 illustrates the effect of this operation (addition of an entry from the LUT to max($A_0$, $A_1$)) on the final result of a max* operation. Such an operation may result in a carry injection at the p3 bit position of max($A_0$,$A_1$). In FIG. 4, bits p0 to p2 together define max($A_0$,$A_1$)$_L$. The bit vector defined by t0 to t2 represents an entry from the LUT. For concurrent computations, the correction operation is addressed by splitting the result of an add-max* operation into higher order and lower order segments max*($A_0$,$A_1$)$_H$ and max*($A_0$,$A_1$)$_L$. The following propositions present the impact of the correction operation on the final result of an add-max* operation.

In accordance with the invention, for m bit look up table entries (e.g., m=3 in FIG. 3), the data represented by the (n−m) higher order bits of the results of an add-max* operation satisfies the following:

$$\text{max*}((d_0+d_1), (d_2+d_3))_H \in \{(d_0+d_1)_H, ((d_0+d_1)_H+1), (d_2+d_3)_H, ((d_2+d_3)_H+1)\} \qquad (5)$$

As mentioned above, the addition of a correction term that is m bits long (m<n) with the result of a max operation may result in the injection of a carry at the LSB position of the higher order component of the result. If there is no overflow carry from the correction addition, then the higher order segments of max and max* operations are the same. Indeed, depending on whether $(d_0+d_1) \geq (d_2+d_3)$, and the generation of a carry input during the correction addition, the set of all possible values that max*($(d_0+d_1)$, $(d_2+d_3)$)$_H$ can assume is limited to that contained in the following set: $\{(d_0+d_1)_H, ((d_0+d_1)_H+1), (d_2+d_3)_H, ((d_2+d_3)_H+1)\}$.

Furthermore, in accordance with the present invention, the set of all possible values that the lower order m bits of an add-max* operation can assume satisfies the following:

$$\max *((d_0 + d_1), (d_2 + d_3))_L \in \qquad (6)$$

$$\begin{Bmatrix} (d_0 + d_1)_L, ((d_0 + d_1)_L + 1), \\ ((d_0 + d_1)_L + 2), \ldots, ((d_0 + d_1)_L + t_{\max}), \\ (d_2 + d_3)_L, ((d_2 + d_3)_L + 1), ((d_2 + d_3)_L + 2), \ldots, \\ ((d_2 + d_3)_L + (t_{\max} - 1)) \end{Bmatrix}$$

Depending on the base and bound restrictions of $|(d_0+d_1)-(d_2+d_3)|$, LUT entries of $0, 1, 2, \ldots, t_{max}$ may be added with the result of the add-max operation. However, when $|(d_0+d_1)-(d_2+d_3)|=0$, the addition of $t_{max}$ need be done with only one of $(d_0+d_1)$ or $(d_2+d_3)$.

The above two propositions suggest that, indeed, the set of all possible values that the result of an add-max* operation can assume may be computed in parallel. As mentioned above, comparisons may also be performed concurrently. As soon as the results of comparisons are available, appropriate components of add-max*$( )_H$ and add-max*$( )_L$ may be selected.

FIG. 5 illustrates an algorithm that performs substantially concurrent add-max* computations in accordance with an embodiment of the invention. As shown, the algorithm 50 comprises three steps (I, II and III).

Steps 52 (step I) and 54 (step II) of the algorithm 50 are performed concurrently. These two steps together perform concurrent add-compare. More specifically, operations specified in steps I and II of the algorithm are performed concurrently. This includes all the sub-operations in each step, i.e., the set of all operations specified in steps I and II are concurrent. Step I encompasses the set of all possible additions, while step II encompasses the set of all comparisons. As previously explained, additions and comparisons are performed substantially concurrently. Also, the look up table reading operation is transformed into concurrent comparison operations.

With reference again to FIG. 5, in step 52, the set of all possible components of the final result are generated. Here, the LUT presented in FIG. 3 is taken as the reference for correction additions. Thus, step 52 evaluates $\{(d_0+d_1)_H, (d_0+d_1)_H+1\}$, $\{(d_0+d_1)_L, (d_0+d_1)_L+1, (d_0+d_1)_L+2, (d_0+d_1)_L+3, (d_0+d_1)_L+4, (d_0+d_1)_L+5, (d_0+d_1)_L+6\}$, $\{(d_2+d_3)_H, (d_2+d_3)_H+1\}$ and $\{(d_2+d_3)_L, (d_2+d_3)_L+1, (d_2+d_3)_L+2, (d_2+d_3)_L+3, (d_2+d_3)_L+4, (d_2+d_3)_L+5\}$, concurrently.

During step 54, the set of all possible comparator conditions are evaluated. Thus, step 54 evaluates conditions $\{[(d_0+d_1)=(d_2+d_3)], [(d_0+d_1)\geq(d_2+d_3)], [0<((d_0+d_1)-(d_2+d_3))\leq 2], [2<((d_0+d_1)-(d_2+d_3))\leq 4], [4<((d_0+d_1)-(d_2+d_3))\leq 8], [8<((d_0+d_1)-(d_2+d_3))\leq 12], [12<((d_0+d_1)-(d_2+d_3))\leq 21], [0<((d_2+d_3)-(d_0+d_1))\leq 2], [2<((d_2+d_3)-(d_0+d_1))\leq 4], [4<((d_2+d_3)-(d_0+d_1))\leq 8], [8<((d_2+d_3)-(d_0+d_1))\leq 12]$ and $[12<((d_2+d_3)-(d_0+d_1))\leq 21]$, concurrently.

These comparator outputs drive the result selection in step 56 (step III). In step 56, the result of the add-max* operation is formed through the concatenation of the relevant lower order and higher order segments of results formed in step 52. Thus, step 56 selects the appropriate element $(d_0+d_1)_L$ plus correction or $(d_2+d_3)_L$ plus correction, as well as the overflow carries, on the basis of the comparisons performed in step 54. Then, step 56 uses $[(d_0+d_1)\geq(d_2+d_3)]$, and the overflow carry, for the selection of a relevant element of $\{(d_0+d_1)_H, (d_0+d_1)_H+1, (d_2+d_3)_H, (d_2+d_3)_H+1\}$. Then, step 56 concatenates the most significant bit (MSB) and least significant bit (LSB) segments of the result.

V. Concurrent Add-Compare-Select-Add Logic

Figure 6:
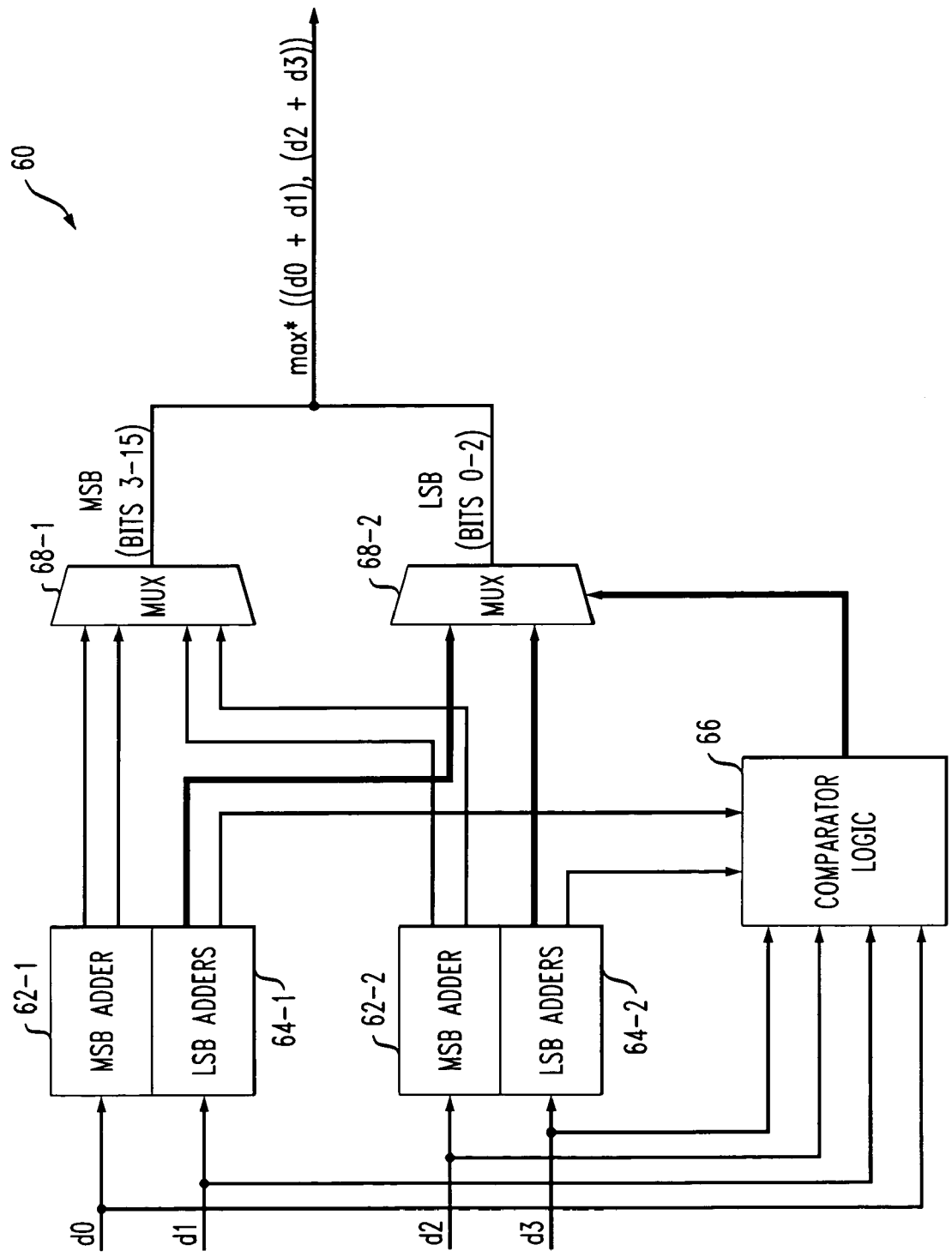
FIG. 6 is a block diagram illustrating an add-compare-select-add module according to an embodiment of the present invention.

FIG. 6 is a block diagram generally illustrating an add-compare-select-add module for implementing an add-max* operation according to an embodiment of the present invention. For example, the add-compare-select-add module of FIG. 6 may be used to implement the add-max* algorithm described above in the context of FIG. 5. As shown, the add-compare-select-add module 60 comprises a first MSB adder block 62-1, a first LSB adder block 64-1, a second MSB adder block 62-2, a second LSB adder block 64-2, a comparator logic block 66, a first multiplexer block 68-1 and a second multiplexer block 68-2.

The structure implements substantially concurrent add-compare-select operations, and substantially concurrent addition of an appropriate entry from the look up table with max((d0+d1), (d2+d3)). The MSB adder blocks 62-1 and 62-2 evaluate $(d_0+d_1)_H$, $(d_0+d_1)_H+1$, $(d_2+d_3)_H$ and $(d_2+d_3)_H+1$ concurrently, e.g., as depicted in step 52 of FIG. 5. In these operations, overflow carries from $(d_0+d_1)_L$ and $(d_2+d_3)_L$ are assimilated into the sums $(d_0+d_1)_H$ and $(d_2+d_3)_H$. The LSB adder blocks 64-1 and 64-2 compute the set of all possible combinations of $(d_0+d_1)_L$+LUT and $(d_2+d_3)_L$+LUT. This is part of step I, but it is to be understood that signals from logic blocks 64-1 and 64-2 are used in logic block 66. The comparator logic block 66 evaluates the set of all comparator conditions listed in step 54 of FIG. 5. This logic also accepts carry outputs from the different LSB adders. Based on these carries as well as the evaluation of different comparison conditions, signals that facilitate the selection of appropriate MSB and LSB components of results (generated as per the listing presented in step I of FIG. 5) are resolved. Selection occurs in step III.

A numerical example illustrating the add-max* operation according to the invention will now be given:

Input data (decimal values): d0 = 256, d1 = 28, d2 = 288, d3 = −28

Step I - Concurrent additions

| | | |
|---|---|---|
| (d0 + d1)$_H$ | 0000000100011 | |
| (d0 + d1)$_H$ + 1 | 0000000100100 | |
| (d0 + d1)$_L$ | | 100 |
| (d0 + d1)$_L$ + 1 | | 101 |
| (d0 + d1)$_L$ + 2 | | 110 |
| (d0 + d1)$_L$ + 3 | | 111 |
| (d0 + d1)$_L$ + 4 | | 000    Carry out = 1 |
| (d0 + d1)$_L$ + 5 | | 001    Carry out = 1 |
| (d0 + d1)$_L$ + 6 | | 010    Carry out = 1 |
| (d2 + d3)$_H$ | 0000000100000 | |
| (d2 + d3)$_H$ + 1 | 0000000100001 | |
| (d2 + d3)$_L$ | | 100 |
| (d2 + d3)$_L$ + 1 | | 101 |
| (d2 + d3)$_L$ + 2 | | 110 |
| (d2 + d3)$_L$ + 3 | | 111 |
| (d2 + d3)$_L$ + 4 | | 000    Carry out = 1 |
| (d2 + d3)$_L$ + 5 | | 001    Carry out = 1 |

Step II - Concurrent comparisons

| | |
|---|---|
| (d0 + d1) = (d2 + d3) | No |
| (d0 + d1) ≥ (d2 + d3) | Yes |
| 0 < {(d0 + d1) − (d2 + d3)} ≤ 2 | No |
| 2 < {(d0 + d1) − (d2 + d3)} ≤ 4 | No |
| 4 < {(d0 + d1) − (d2 + d3)} ≤ 8 | No |
| 8 < {(d0 + d1) − (d2 + d3)} ≤ 12 | No |
| 12 < {(d0 + d1) − (d2 + d3)} ≤ 21 | No |
| 0 < {(d2 + d3) − (d0 + d1)} ≤ 2 | No |
| 2 < {(d2 + d3) − (d0 + d1)} ≤ 4 | No |
| 4 < {(d2 + d3) − (d0 + d1)} ≤ 8 | No |
| 8 < {(d2 + d3) − (d0 + d1)} ≤ 12 | No |
| 12 < {(d2 + d3) − (d0 + d1)} ≤ 21 | No |

Step III—Result Selection and Concatenation

From the above comparison procedure, it is clear that $\{(d0+d1)-(d2+d3)\} \geq 22$. In this scenario, the result is (d0+d1) which is the concatenated version of $(d0+d1)_H$ and $(d0+d1)_L$=0000000100011100 (decimal value=284).

Thus, as illustrated above, input sets are added. Two sums are generated. Here, the MSB results are separated. Also, MSB results plus one are also formed. Thus, there are a total of four MSB results. Substantially simultaneously, correction additions are also performed. This is mainly LSB adds. Thirteen three-bit results plus appropriate "Cout values" are generated. Substantially simultaneously, the sums are compared. These are the sums before correction. Also, the difference between these sums are compared for base and bound behavior, e.g., $0<((d0+d1)-(d2+d3)) \leq 2$. Here, 0 is the base value and 2 is the bound value. The result of this operation is the assertion of one bit, and this bit is resolved through comparison. Since the result can only belong to one base and bound bin, only one comparator output becomes true. This output is used for the selection of the appropriate LSB result. The Cout from the corresponding LSB adder is used to select the MSB part of the final result.

Further, as is evident, the techniques of the invention allow a turbo decoder to operate without the use of correction value lookup table (LUT) read operations. This is because the typical LUT read operation is transformed into base and bound resolution comparisons in accordance with the invention.

VLSI implementation considerations indicate that, the critical path of the inventive add-compare-select-add methodology of the invention spans the comparator and selection (MUX) logic. Because of this, the methodology may operate with simple adders, in contrast to that of conventional schemes.

It should be understood that in an ACS module (associated with a Viterbi decoder), there is only one set of addition. That is, two potential metrics are computed in parallel, and the larger one is selected. However, add-max* is more complicated. To begin with, let us say ACS operations are performed in add-max* also. While the smaller metric is altogether discarded in Viterbi ACS operations, this is not quite true in turbo decoding. In turbo decoding, the larger of the metrics as well as the absolute value of the difference between the competing potential metrics are computed. That means, even though the smaller metric is discarded here also, the information relating to the difference between the competing metrics is retained. Based on the absolute value of this difference, an entry from the look up table is selected, and this entry is added to the larger metric already selected. The differences between ACS of Viterbi and add-max* of turbo decoders may be inferred from FIG. 1. The similarity between these are reflected by the modules 12-1, 12-2, 12-3 and 14. These modules together represent a 2 way ACS. The modules 16, 18 and 12-4 together empower look up table reading and correction addition, dictated in add-max* operation.

VI. Concurrent Compare-Select-Add Logic

While the concurrent add-max* algorithm speeds up state metric calculations, the computation of log likelihood rations (LLRs) demands simple max* operations. Thus, the present invention also provides a fast max* logic implementation. As will be evident, the max* logic reflects simplifying modifications made to the logic illustrated in FIG. 6.

Figure 7:
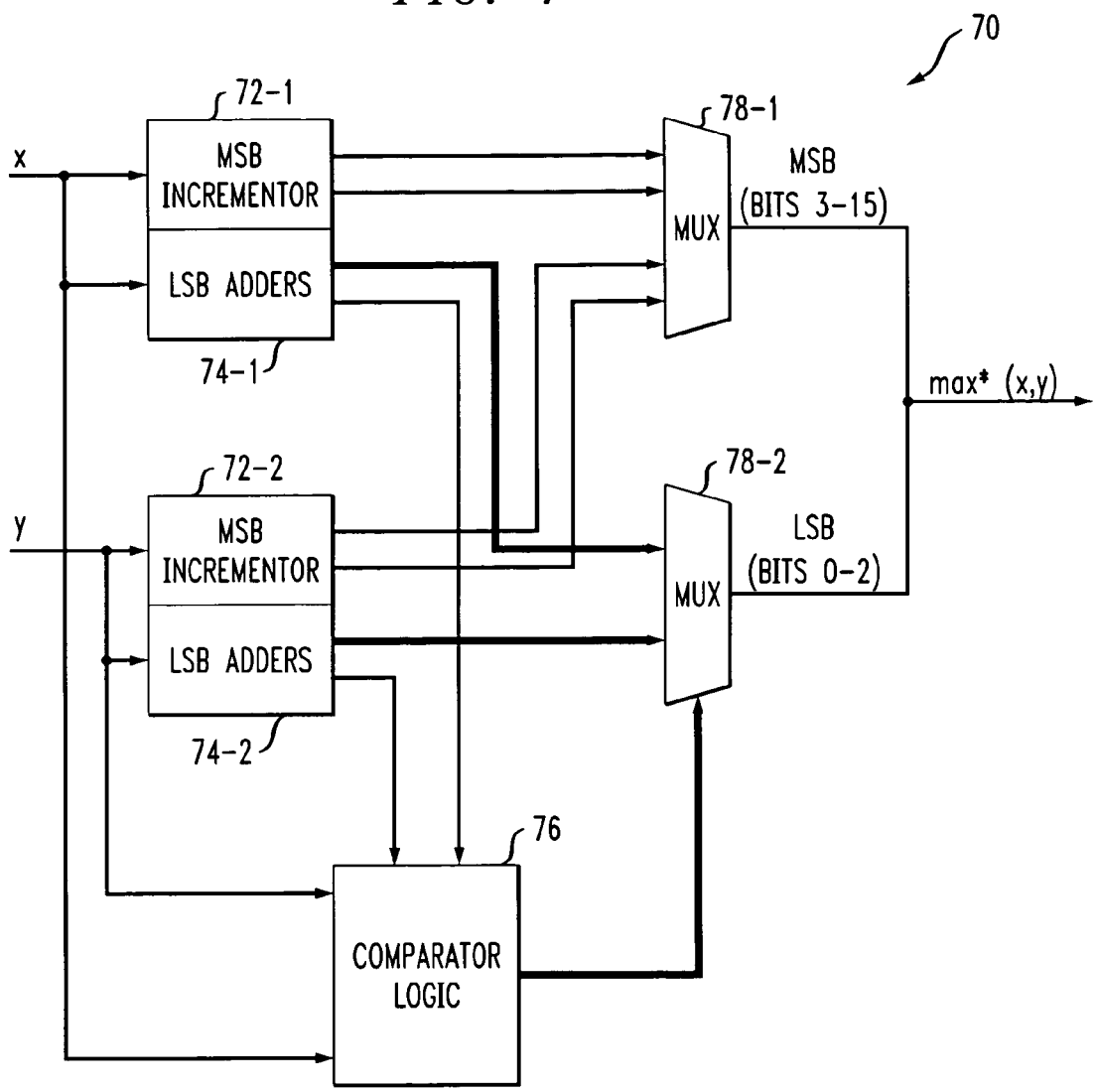
FIG. 7 is a block diagram illustrating a compare-select-add module according to an embodiment of the present invention.

FIG. 7 is a block diagram generally illustrating a compare-select-add module for implementing a max* operation according to an embodiment of the present invention. As shown, the compare-select-add module 70 comprises a first MSB incrementor block 72-1, a first LSB adder block 74-1, a second MSB incrementor block 72-2, a second LSB adder block 74-2, a comparator logic block 76, a first multiplexer block 78-1 and a second multiplexer block 78-1. The module 70 accepts x, y inputs and evaluates max*(x,y). Based on explanations above, it can be concluded that $\max^*(x,y)_H \in \{x_H, x_H+1, y_H, y_H+1\}$. The MSB incrementor blocks 72-1 and 72-2 evaluate these values, concurrently. The LSB adder blocks 74-1 and 74-2 evaluate the set of all possible values of x+LUT and y+LUT, concurrently. Analogous to that given in FIG. 5, the comparator conditions are: $\{x \geq y, x=y, 0<(x-y)\leq 2, 2<(x-y)\leq 4, 4<(x-y)\leq 8, 8<(x-y)\leq 12, 12<(x-y)\leq 21, 0<(y-x)\leq 2, 2<(y-x)\leq 4, 4<(y-x)\leq 8, 8<(y-x)\leq 12, 12<(y-x)\leq 21\}$. The comparator logic block 76 evaluates these conditions. Here again, the overflow carry signals from the LSB adder blocks 74-1 and 74-2 are used for the resolution of selection signals. The output multiplexor blocks 78-1 and 78-2 perform the selection of appropriate values.

A numerical example illustrating the max* operation according to the invention will now be given:

| Input data (decimal values): x = 288, y = 284 | | |
|---|---|---|
| Step I - Concurrent additions | | |
| $x_H$ | 0000000100100 | |
| $x_H + 1$ | 0000000100101 | |
| $x_L$ | 000 | |
| $x_L + 1$ | 001 | |
| $x_L + 2$ | 010 | |
| $x_L + 3$ | 011 | |
| $x_L + 4$ | 100 | |
| $x_L + 5$ | 101 | |
| $x_L + 6$ | 110 | |
| $y_H$ | 0000000100011 | |
| $y_H + 1$ | 0000000100100 | |
| $y_L$ | 100 | |
| $y_L + 1$ | 101 | |
| $y_L + 2$ | 110 | |
| $y_L + 3$ | 111 | |
| $y_L + 4$ | 000 | Carry out = 1 |
| $y_L + 5$ | 001 | Carry out = 1 |
| Step II - Concurrent comparisons | | |
| x = y | No | |
| x ≥ y | Yes | |
| 0 < (x − y) ≤ 2 | No | |
| 2 < (x − y) ≤ 4 | Yes | |
| 4 < (x − y) ≤ 8 | No | |
| 8 < (x − y) ≤ 12 | No | |
| 12 < (x − y) ≤ 21 | No | |
| 0 < (y − x) ≤ 2 | No | |
| 2 < (y − x) ≤ 4 | No | |
| 4 < (y − x) ≤ 8 | No | |
| 8 < (y − x) ≤ 12 | No | |
| 12 < (y − x) ≤ 21 | No | |

Step III—Result Selection and Concatenation

From the above comparison procedure, it is clear that $2<(x-y)\leq 4$. In this scenario, the result is x+4 which is the concatenated version of $x_H$ and $x_L+4$ which is =0000000100100100 (decimal value=292).

VII. Comparator Organization

From FIG. 5, step II, it is clear that the bitwise data handled by the different comparators differ only at the lower significant bit positions. For example, consider the following pair of comparisons: $0<\{(d0+d1)-(d2+d3)\}<2$ and $2<\{(d0+d1)-(d2+d3)\}\leq 4$. A closer examination indicates that for multi-operand add-compares, the data appearing at a few, finite, LSB positions (5 LSB bits if the LUT given in FIG. 3 is taken as the reference) are different for different, comparators, while the MSB data remains the same. The rationale behind the partitioning of addition operations into higher order and lower order segments has been explained above. Extending this approach, the comparators themselves may be partitioned into higher order and lower order bit segments. The final results may be obtained by logically combining the results from these high and low segments of different comparators. With this approach, the multitude of comparison conditions are essentially evaluated by a number of small comparators that handle fewer bits in comparison to the actual data width. The net benefit is a reduction in area and power consumption.

VIII. Implementation Considerations

With device geometry features shrinking down to sub-0.1 micron sizes; in general, layout geometries and wire lengths play a critical role as far as delay implications of arithmetic/logic circuits are concerned. In the following delay analysis, the layout geometry/parasitic effects are lumped into driver delays.

In general, the fastest adders deliver results in logarithmic time. This is the case with comparators as well. From FIG. 1, it can be seen that there are three carry propagate additions in series. The selection of a result after comparison necessitates driving large fanout MUX selection lines. Depending on routing geometry, the parasitic loading of these lines can be significant. Assuming that the time complexity of selection is comparable to that of addition, the delay measure for the execution of add-compare-select-add in series is proportional of 4 $\log_2$ (2*n) where n is the width of input operands.

As mentioned above, the critical path of the methodologies implemented in FIGS. 6 and 7 span through comparators and output selection circuits. Assuming a fully parallel comparison logic (around 12 comparators), the distribution of input signals implies driver delay. The output selection also involves driver delays. Under the same worst case assumptions that the driver delays are comparable to that of adders, the delay measure of the technique illustrated in FIG. 6 is proportional to 3 log2 (2*n). From this, it is clear that the inventive approach offers a speed up of around 25%, in contrast to the approach illustrated in FIG. 1. Intuitively, it is clear that the max* algorithm implemented in FIG. 7 is faster than conventional approaches.

In digital signal processors (DSPs), owing to fast cycle time requirements, branch metric computations are stretched over a number of cycles. Typically, add-sub operations evaluate tentative state metrics (A0, A1 of equation (2)). These tentative state metrics are subjected to a max* operation for the final resolution of state metrics. From the timing analysis presented above, it is easy to visualize that the time complexity of the inventive concurrent add-max* operation is not appreciably greater than that of max.

Single cycle add-max* operations facilitate low latency computations. Also, some of the register read/write operations demanded by sequential add-sub, max* instructions are absent, thus, the tentative metrics A0, A1 need not be stored/retrieved. Typically, the power consumption of register-ALU (arithmetic logic unit) interfacing buses are substantial, this component of power consumption may even outweigh that of the actual arithmetic/logic structure. From this, it is clear that, in DSPs, add-max* instructions render low power, low latency computations for state metric evaluations.

IX. Instruction Set Comparison

As mentioned above, a delay reduction of around 25% may be realized in accordance with implementations of the concurrent add-compare-select-add operation of the present invention. This translates into frequency boost. Thus, the inventive approach can operate at 1.33 times the frequency of that of a conventional scheme. Higher frequencies ensure higher computational throughput which directly translates into an overall acceleration of the target application. In contrast to temporal parallelism-based (deeper pipelining) approaches, there is no loss of cycles due to pipeline filling/flushing operations in accordance with the techniques of the invention. This is one of the philosophical motivations behind the quest for VLIW architectures and superscalar micro-architectures that exploit spatial parallelism. That is, spatial parallelism provides substantial performance boosts.

The following discussion presents a comparison between add-compare-select-add implementations using traditional instructions and the proposed instruction on single issue DSPs/microprocessors. For this discussion, assume that a possible implementation using a sequence of instructions supported by a traditional instruction set may be:

ADD D0, D1, D2
ADD D3, D4, D5
LNABS D2, D5, D6
CMPSEL D2, D5, D7
ADD D6, D7, D8

In contrast, an instruction set implementation using the invention may simply be:

ADDMAX* D0:D1, D2, D3

The instruction syntax is:<Instruction pneumonic source1, source2, destination>. It is assumed that the target processors employ load/store architecture. The Dxs represent registers. The ADD instructions add the data held by the source registers and store the result in the destination register. The LNABS instruction evaluates the function ln $(1+e^{-|source1-source2|})$. The CMPSEL instruction selects the larger of its source operands and stores it in the destination register. One of the sources of the ADDMAX* instruction is a register pair, D0:D1 which together holds the same data held by registers D0 and D3. D2 holds the data held by D1 and D4. In many implementations, D1 and D4 hold the same numerical data, but are of opposite sign.

From the above instruction set implementations, it should be understood that in a processor that supports the traditional instruction set, in order to implement the add-compare-select-add computation, at least five instructions need be executed. With the instruction associated with the invention and supporting micro-architecture (as explained above), only one instruction need be executed. Reduction in code size, register space, encoding space and register ports are realized. While the above comparison contrasts the merits of the instruction associated with the invention on single issue DSPs/microprocessors, it is to be understood that even VLIW/EPIC/superscalar processors can also exploit the benefits of the inventive approach. Also, the data path organization of the invention can be advantageously employed in ASIC (application specific integrated circuit) designs, or even GA/FPGA (gate array/field programmable gate array) implementations, targeting a variety of applications.

Further, the example of a look up table (LUT) for the evaluation of ln $(1+e^{-|A0-A1|})$, presented above, uses 3 bit quantization. That is, the natural logarithms are quantized into 3 bit numbers. However, there exists other implementations that use 4 bit quantization. The number of entries of the LUTs can also be different. For example, a LUT may have as few as 8 entries. However, the approach of the invention contemplates implementation in accordance with any possible LUT variants. The approach of the invention transforms the sequential add, compare, select, look up table read and subsequent addition operations into concurrent additions (which start right at the beginning of a clock cycle). Concurrent comparisons are used for the selection of results. The differences in the number of look up table entries reflect on the number of concurrent additions and comparisons. The larger the number of entries, the larger the number of concurrent additions and comparisons. The quantization issue reflects on the partitioning of adders into components that produce higher order and lower order segments of potential results.

Still further, the inventive approach, by way of parallelization of arithmetic/logic operations, removes two performance hungry carry propagate additions from the critical path of the computing structure. The inherent speed performance potential of the inventive techniques render them ideal for the implementation of high speed turbo decoders.

Figure 8:
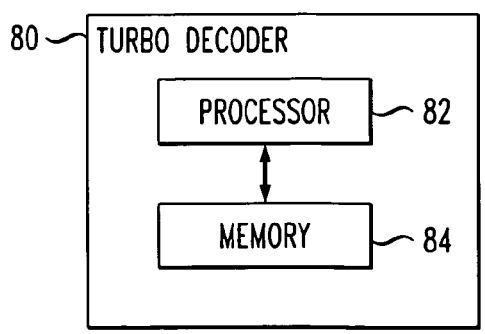
FIG. 8 is a block diagram illustrating an embodiment of a turbo decoder for use in accordance with the present invention.

Referring now to FIG. 8, a block diagram illustrates an embodiment of a turbo decoder for use in accordance with the present invention. As is known, a turbo decoder is typically one functional processing block in a receiver portion of a transceiver configured for use in a communications system, such as a mobile digital cellular telephone. The turbo decoder typically performs error correction functions. As shown in FIG. 8, a turbo decoder 80 comprises a processor 82 and associated memory 84. It is to be understood that the functional elements of an add-compare-select-add module and a compare-select-add module of the invention, as described above in detail and which make up a part of a turbo decoder, may be implemented in accordance with the decoder embodiment shown in FIG. 8.

The processor 82 and memory 84 may preferably be part of a digital signal processor (DSP) used to implement the turbo decoder. However, it is to be understood that the term "processor" as used herein is generally intended to include one or more processing devices and/or other processing circuitry (e.g., application-specific integrated circuits or ASICs, Gas, FPGAs, etc.). The term "memory" as used herein is generally intended to include memory associated with the one or more processing devices and/or circuitry, such as, for example, RAM, ROM, a fixed and removable memory devices, etc. Also, in another embodiment, the add-compare-select-add module and the compare-select-add module may be implemented in accordance with a coprocessor associated with the DSP used to implement the overall turbo decoder. In such case, the coprocessor could share in use of the memory associated with the DSP.

Accordingly, software components including instructions or code for performing the methodologies of the invention, as described herein, may be stored in the associated memory of the turbo decoder and, when ready to be utilized, loaded in part or in whole and executed by one or more of the processing devices and/or circuitry of the turbo decoder.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A processor-based method of processing data in accordance with a turbo decoder, wherein the turbo decoder performs the method, the method comprising the steps of:

respectively adding data values of two sets of input data to generate a set of sums, the input data being available to the turbo decoder;

substantially concurrent with the addition step, respectively adding correction values to portions of the sums to generate a set of corrected sums;

substantially concurrent with the respective input data value and correction value addition steps, comparing portions of the sums generated in the data value addition step against one another, and comparing an absolute value of a difference between the portions of the sums against first and second values, wherein the comparison step further comprises evaluating at least one carry output of a carry save addition operation; and selecting one of the corrected sums based on the comparison steps.

2. The method of claim 1, wherein the data value addition step, the correction value addition step, and the comparison step are themselves performed concurrently.

3. The method of claim 1, wherein resulting data values are partitioned into higher order components and lower order components.

4. The method of claim 3, wherein a lower order component of a resulting data value comprises m and a higher order component of a resulting data value comprises (n–m) bits, where n is the width of the resulting data value.

5. The method of claim 3, wherein correction values are added to lower order components of associated sums.

6. The method of claim 1, wherein resolution of an appropriate correction value comprises comparison operations that identify a range behavior of an absolute value of a difference between the sums.

7. The method of claim 1, wherein one input value of each set of input values is a previously computed path metric and the other input value of each set of input values is an appropriate branch metric such that the generated sum of the input values plus correction values represent new likely path metrics which may potentially be selected based on the substantially concurrent comparison operation.

8. The method of claim 1, wherein the input value addition step, the correction value addition step, the comparison step, and the selection step are associated with an add-max* operation performed by the turbo decoder.

9. The method of claim 1, wherein the input value addition step, the correction value addition step, the comparison step, and the selection step are associated with a max* operation performed by the turbo decoder.

10. The method of claim 1, wherein the correction value addition step is performed without requiring a lookup table read operation.

11. Apparatus for processing data in accordance with a turbo decoder, the apparatus comprising:

at least one processor of the turbo decoder operative to: (i) respectively add data values of two sets of input data to generate a set of sums, the input data being available to the turbo decoder; (ii) substantially concurrent with the addition step, respectively add correction values to portion of the sums to generate a set of corrected sums; (iii) substantially concurrent with the respective input data value and correction value addition steps, compare portions of the sums generated in the data value addition step against one another, and compare an absolute value of a difference between the portions of the sums against first and second values, wherein the comparison step further comprises evaluating at least one carry output of a carry save addition operation; and (iv) select one of the corrected sums based on the comparison steps; and a memory, coupled to the at least one processor, for storing at least a portion of results associated with one or more of the input value addition step, the correction value addition step, the comparison step, and the selection step.

12. The apparatus of claim 11, wherein the data value addition step, the correction value addition step, and the comparison step are themselves performed concurrently.

13. The apparatus of claim 11, wherein resulting data values are partitioned into higher order components and lower order components.

14. The apparatus of claim 13, wherein a lower order component of a resulting data value comprises m bits and a higher order component of a resulting data value comprises (n–m) bits, where n is the width of the resulting data value.

15. The apparatus of claim 13, wherein correction values are added to lower order components of associated sums.

16. The apparatus of claim 11, wherein resolution of an appropriate correction value comprises comparison operations that identify a behavior of an absolute value of a difference between the sums.

17. The apparatus of claim 11, wherein one input value of each set of input values is a previously computed path metric and the other input value of each set of input values is an appropriate branch metric such that the generated sum of the input values plus correction values represent new likely path metrics which may potentially be selected based on the substantially concurrent comparison operation.

18. The apparatus of claim 11, wherein the input value addition step, the correction value addition step, the comparison step, and the selection step are associated with an add-max* operation performed by the turbo decoder.

19. The apparatus of claim 11, wherein the input value addition step, the correction value addition step, the comparison step, and the selection step are associated with a max* operation performed by the turbo decoder.

20. The apparatus of claim 11, wherein the correction value addition step is performed without requiring a lookup table read operation.

21. A turbo decoder operative to perform a data processing algorithm, the algorithm comprising the steps of:
   respectively adding data values of two sets of input data to generate a set of sums, the input data being available to the turbo decoder;
   substantially concurrent with the addition step, respectively adding correction values to portions of the sums to generate a set of corrected sums;
   substantially concurrent with the respective input data value and correction value addition steps, comparing portions of the sums generated in the data value addition step against one another, and comparing an absolute value of a difference between the portions of the sums against first and second values, wherein the comparison step further comprises evaluating at least one carry output of a carry save addition operation; and
   selecting one of the corrected sums based on the comparison steps.

22. An article of manufacture for use in performing a data processing algorithm in accordance with a turbo decoder, the article comprising a machine readable medium containing one or more programs which when executed by the turbo decoder implement the steps of:
   respectively adding data values of two sets of input data to generate a set of sums, the input data being available to the turbo decoder;
   substantially concurrent with the addition step, respectively adding correction values to portions of the sums to generate a set of corrected sums;
   substantially concurrent with the respective input data value and correction value addition steps, comparing portions of the sums generated in the data value addition step against one another, and comparing an absolute value of a difference between the portions of the sums against first and second values, wherein the comparison step further comprises evaluating at least one carry output of a carry save addition operation; and
   selecting one of the corrected sums based on the comparison steps.

23. An integrated circuit device, the integrated circuit device comprising a turbo decoder operable to:
   respectively adding data values of two sets of input data to generate a set of sums, the input data being available to the turbo decoder;
   substantially concurrent with the addition step, respectively adding correction values to portions of the sums to generate a set of corrected sums;
   substantially concurrent with the respective input data value and correction value addition steps, comparing portions of the sums generated in the data value addition step against one another, and comparing an absolute value of a difference between the portions of the sums against first and second values, wherein the comparison step further comprises evaluating at least one carry output of a carry save addition operation; and
   selecting one of the corrected sums based on the comparison steps.

* * * * *